US007058916B2

(12) United States Patent
Phelps et al.

(10) Patent No.: US 7,058,916 B2
(45) Date of Patent: Jun. 6, 2006

(54) METHOD FOR AUTOMATICALLY SIZING AND BIASING CIRCUITS BY MEANS OF A DATABASE

(75) Inventors: Rodney Phelps, Pittsburgh, PA (US); Ronald A. Rohrer, Saratoga, CA (US); Anthony J. Gadient, Pittsburgh, PA (US); Rob A. Rutenbar, Pittsburgh, PA (US); L. Richard Carley, Sewickley, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 241 days.

(21) Appl. No.: 10/174,395

(22) Filed: Jun. 18, 2002

(65) Prior Publication Data

US 2003/0009729 A1 Jan. 9, 2003

Related U.S. Application Data

(60) Provisional application No. 60/301,595, filed on Jun. 28, 2001.

(51) Int. Cl.
G06F 17/50 (2006.01)

(52) U.S. Cl. .................. 716/11; 716/1; 716/2; 716/4; 716/7; 716/8; 716/16; 716/17

(58) Field of Classification Search .................. 716/1, 716/2, 4, 6, 8, 11, 17, 18, 7, 16; 714/744; 707/101; 703/14; 700/96; 326/119; 324/752
See application file for complete search history.

(56) References Cited

U.S. PATENT DOCUMENTS

| 5,513,119 | A | * | 4/1996 | Moore et al. ................. 716/8 |
| 5,757,655 | A | * | 5/1998 | Shih et al. ..................... 716/2 |
| 6,131,182 | A | * | 10/2000 | Beakes et al. ................ 716/8 |
| 6,490,715 | B1 | * | 12/2002 | Moriwaki et al. ............. 716/17 |
| 6,529,913 | B1 | * | 3/2003 | Doig et al. ................. 707/101 |
| 6,539,533 | B1 | * | 3/2003 | Brown et al. ................. 716/17 |
| 2002/0175713 | A1 | * | 11/2002 | Knowles ..................... 326/119 |

* cited by examiner

*Primary Examiner*—A. M. Thompson
*Assistant Examiner*—Helen Rossoshek
(74) *Attorney, Agent, or Firm*—Morrison & Foerster LLP

(57) ABSTRACT

In a method of automatically sizing and biasing a circuit, a database is provided including a plurality of records related to cells that can be utilized to form an integrated circuit. A cell parameter of a cell for a circuit is selected and compared to cell parameters residing in the records stored in the database. One record in the database is selected based upon this comparison and a performance characteristic of the circuit is determined from this record.

43 Claims, 7 Drawing Sheets

| CELL # | CELL TYPE | GAIN | PHASE MARGIN | UNITY GAIN FREQ. | HARMONIC DISTORTION | SETTLING TIME | POWER DISSIPATION |
|---|---|---|---|---|---|---|---|
| 0 | OP-AMP | 1 | 90% | ∼ | ∼ | ∼ | ∼ |
| 1 | OP-AMP | 2 | 120% | ∼ | ∼ | ∼ | ∼ |
| 2 | A/D | | | | | | |
| 3 | OP-AMP | 3 | 150% | ∼ | ∼ | ∼ | ∼ |
| 4 | D/A | | | | | | |
| 5 | OP-AMP | 4 | 170% | ∼ | ∼ | ∼ | ∼ |
| 6 | H.P. FILTER | | | | | | |
| 7 | VCO | | | | | | |

FIG. 4

| DEVICE # | DEVICE TYPE | LENGTH | WIDTH | NUMBER OF FINGERS |
|---|---|---|---|---|
| 0 | TRANS. | L0 | W0 | NF0 |
| 1 | TRANS. | L1 | W1 | NF1 |
| 2 | TRANS. | L2 | W2 | NF2 |
| 3 | CURRENT SOURCE | L3 | W3 | — |
| 4 | RESISTOR | L4 | W4 | — |
| 5 | CAP. | L5 | W5 | — |
| 6 | INDUCTOR | L6 | W6 | — |

METHOD FOR AUTOMATICALLY SIZING AND BIASING CIRCUITS BY MEANS OF A DATABASE

CROSS REFERENCE TO RELATED APPLICATIONS

This application claims the benefit of U.S. Provisional Patent Application Ser. No. 60/301,595, filed Jun. 28, 2001.

BACKGROUND OF THE INVENTION

1. Field of the Invention

The present invention relates to sizing and biasing of devices utilized to form a circuit that satisfies a set of performance parameters.

2. Description of Related Art

Heretofore, custom integrated circuits were designed by interconnecting a plurality of devices such as transistors, resistors, capacitors, inductors, diodes, and the like to form cells. In a simple custom integrated circuit, one cell could form the entire circuit. However, in more complex circuits, an interconnection of plural cells may be needed to form the circuit.

Currently, two processes are utilized to design custom integrated circuits; namely, a bottom-up approach and a top-down approach. The bottom-up approach begins with cells in the lowest part of the design. After those cells are designed and connected together, the next level of cells are designed and connected together. This process continues until the circuit is complete.

At each level, the circuit's performance characteristic is measured and a decision is made whether further design is required at the current level, to begin design on the next level or to return to a lower level and redesign it. Redesign is typical because it is not easy to predict the performance of a design before detailed simulation, and detailed simulation requires that a design be well defined.

The top-down approach begins at the highest level in the circuit and derives the performance characteristic for each cell at that level. The design proceeds down each level until the cells at the lowest level have been defined in terms of devices. Like the bottom-up approach, redesign is typical and the design process is highly iterative. The main problems occur because accurately predicting the performance of cells before they are designed is difficult and error prone.

It is, therefore, an object of the present invention to overcome the above problems and others by providing a method of selecting cells utilized to form a circuit in a manner that avoids iterative redesign of one or more of the cells to achieve a circuit having a desired performance characteristic. Still other objects will become apparent to those of ordinary skill in the art upon reading and understanding the following detailed description.

SUMMARY OF THE INVENTION

Accordingly, we have invented a method of automatically sizing and biasing a circuit. The method includes providing a database including a plurality of records related to cells that can be utilized to form an integrated circuit. Each record includes the data regarding devices included in a corresponding cell, an interconnecting scheme of the devices included in the corresponding cell and at least one cell parameter for the corresponding cell. Each record can also include data regarding a semiconductor process technology that could be utilized to form the circuit. A cell parameter of a cell for a circuit is received and compared to one or more cell parameters stored in the database. A record in the database is identified based upon the comparison and a performance characteristic of the circuit is determined from the identified record.

At least one device parameter can be input for a device that is included in the circuit and the performance characteristic for the circuit can be determined from the input device parameter.

The step of determining the performance characteristic for the circuit can include inputting data comprising the identified record into a circuit simulator and receiving from the circuit simulator the performance characteristic for the circuit.

The step of providing the database can include determining a layout of the devices included in each cell and determining the interconnection scheme for the devices included in each cell. The layout and interconnection scheme for each cell are input into the circuit simulator which outputs for each cell the at least one cell parameter. A record is then created in the database for each cell, with each record including the layout of the devices included in the cell, the interconnection scheme for the devices included in the cell and the at least one cell parameter for the cell.

The comparing step can include determining the cell parameter stored in the database that is most closely related to the input cell parameter. The selecting step can include identifying in the database the record that has the cell parameter that was determined to be the most closely related to the input cell parameter. The determination of the most closely related relation can be based on a weighting applied to the cell parameter of the record and the input cell parameter.

The comparing step can also include determining the at least one cell parameter constraint and determining from the cell parameters stored in the database a plurality of cell parameters that comply with the at least one cell parameter constraint. Thereafter, from the plurality of cell parameters that comply with the at least one cell parameter constraint, the cell parameter stored in the database that is most closely related to the input cell parameter is determined.

The at least one cell parameter constraint comprises a constraint on at least one of a cell type and another cell parameter.

We have also invented a method of automatically sizing and biasing a circuit formed from at least one cell having a plurality of interconnected devices. The method includes providing a database including a plurality of cell records stored therein. Each cell record includes a layout of devices, an interconnection scheme for the devices and at least one cell parameter. A cell parameter is received for a cell desired to be utilized to form a circuit. The cell record that includes a cell parameter that has a predetermined relation to the received cell parameter is identified in the database. From the thus identified cell record, the layout of devices and the interconnection scheme for the devices is extracted. The circuit is simulated utilizing the extracted layout of devices and the extracted interconnection scheme for the devices. A performance characteristic is determined for the simulated circuit.

It can be determined if the performance characteristic has a predetermined relation to a desired performance characteristic for the circuit. If not, a new cell parameter is received and utilized to identify another cell record that includes a cell parameter having a predetermined relation to the new cell parameter. From this other cell record, a new layout of devices and a new interconnection scheme of devices is extracted. The circuit is simulated utilizing the new layout and interconnection scheme and a new performance characteristic for the circuit is determined.

The steps of receiving, identifying, extracting and simulating can be repeated for a plurality of cells utilized to form the circuit and the extracted layouts and interconnection schemes for the identified cells can be interconnected to form the circuit whereupon the circuit simulation is conducted utilizing the plurality of interconnected cells.

In the identifying step, the predetermined relation includes the cell parameter stored in the database that is most closely related to the received cell parameter. The most closely related relation can be based on a weighting applied to the cell parameter stored in the database and/or the received cell parameter.

The identifying step can include determining a constraint that can be applied to cell parameters stored in the database and determining cell parameters stored in the database that comply with the constraint. From the constraint compliance cell parameters, the cell parameter stored in the database that has the predetermined relation to the received cell parameter can be determined.

The method can also include receiving a device parameter for a device utilized to form the circuit and simulating the circuit utilizing the received device parameter.

Lastly, the providing step can include determining a layout of devices forming each cell and determining the interconnection scheme for the devices forming the cell. The thus determined layout and interconnection scheme can be input into a circuit simulator which outputs at least one cell parameter based on these inputs. A cell record for this cell can then be included in the database. This cell record includes the thus determined layout and interconnection scheme and the received cell parameter.

DETAILED DESCRIPTION OF THE INVENTION

The present invention will be described with reference to the accompanying figures where like reference numbers correspond to like elements.

Figure 1:
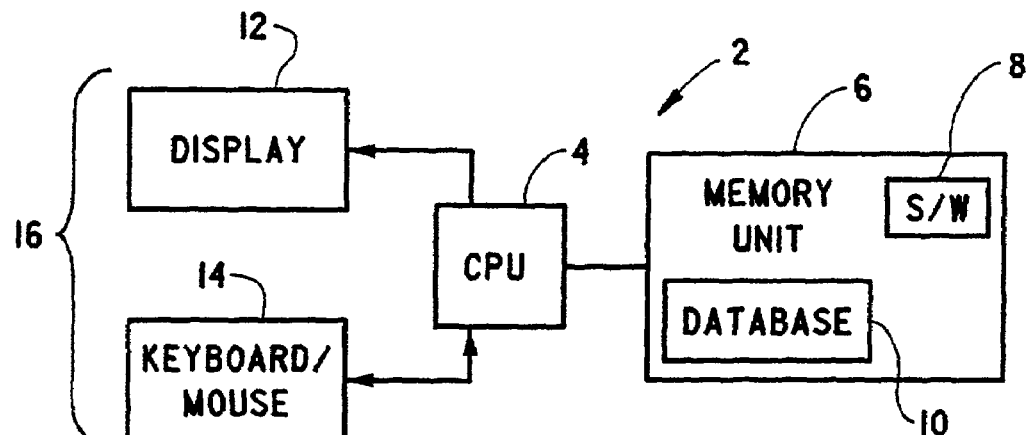
FIG. 1 is a generalized schematic drawing of a computer which is utilized to execute software embodying the present invention.

With reference to FIG. 1, the present invention is embodied in integrated circuit design software 8 which controls the operation of a computer 2 in a predetermined manner to implement the present invention. Computer 2 includes a CPU 4 which is coupled to a memory unit 6 which stores software 8 and a database 10, to be described hereinafter. Memory unit 6 includes one or more of RAM, ROM, magnetic data storage, optical data storage and the like required for the execution and operation of software 8 by CPU 4.

Computer 2 also includes a display 12 and a keyboard/mouse 14 which collectively act as a user interface 16 between computer 2 operating under the control of software 8 and a user of computer 2. Computer 2 is shown for the purpose of illustration and is not to be construed as limiting the invention.

Figure 2:
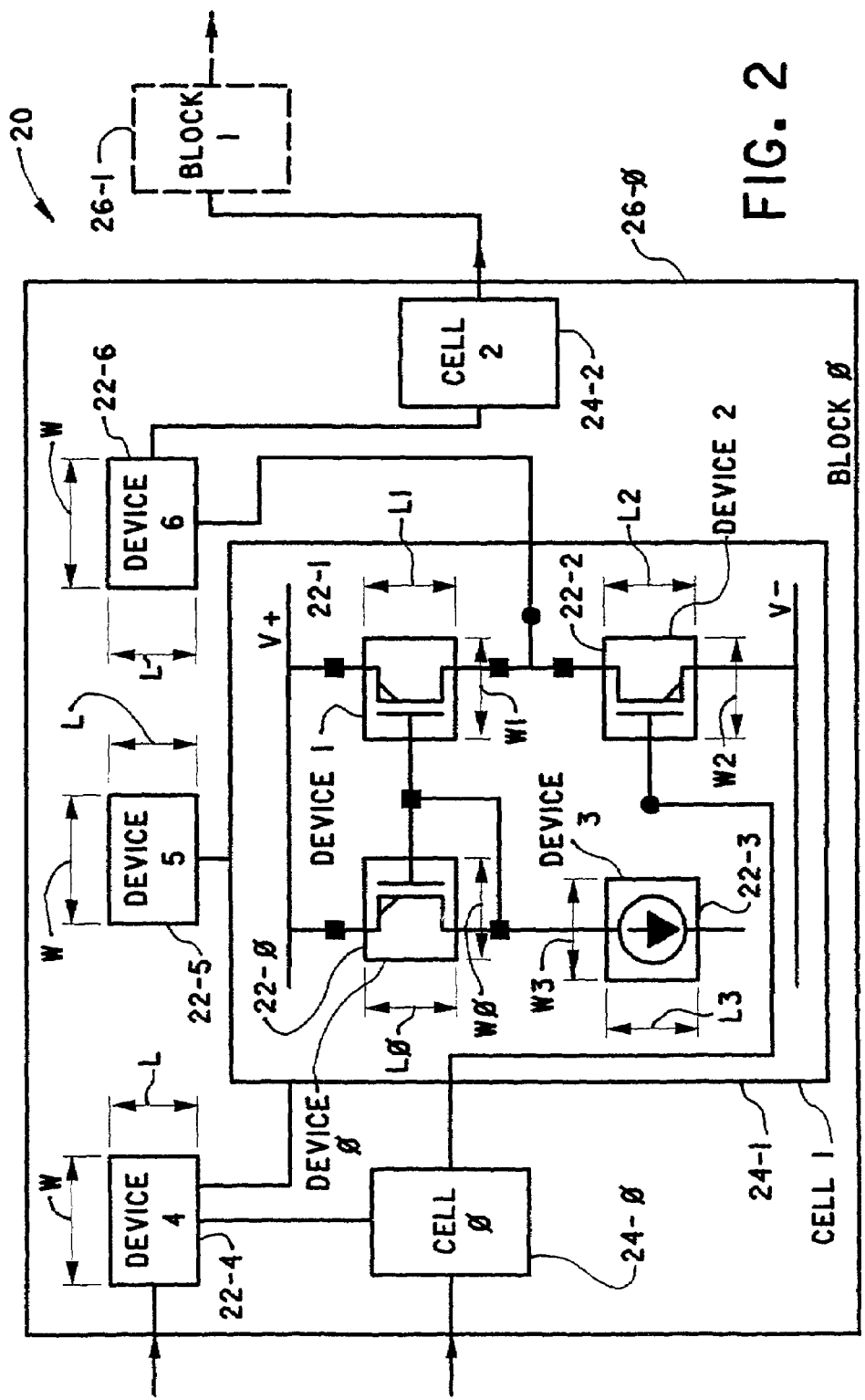
FIG. 2 is a schematic illustration of an exemplary circuit formed from devices and cells, where each cell is formed from two or more devices.

With reference to FIG. 2 and with continuing reference to FIG. 1, software 8 is configured to automatically size and bias devices 22 and/or cells 24 that are utilized to form an integrated circuit 20 from data received via user interface 16. More specifically, a user of computer 2 inputs into software 8 via user interface 16, one or more desired device and/or cell parameters of devices 22 and cells 24 which form circuit 20. In response to receiving these parameters, software 8 implements a layout of the devices, e.g., 22-0–22-7, and cells, e.g., 24-0–24-2, comprising circuit 20 and interconnects these devices 22 and cells 24 in a manner prescribed by the user of computer 2.

More specifically, software 8 implements the design of each cell 24 of circuit 20 from design rules incorporated into software 8 or from cell records 50, described hereinafter, archived in database 10. The design rules establish, among other things, the topological arrangement of devices 22 forming a cell 24. This topological arrangement can include, among other things, the size of each device 22 forming the cell 24, the spacing between each device 22 forming the cell 24 and/or the location of each device 22 forming the cell 24.

In practice, each device 22 is typically a stand-alone circuit element, such as a transistor, resistor, capacitor, inductor, diode and the like whereas each cell 24 is comprised of two or more interconnected devices 22 that are topologically arranged with respect to each in accordance with the design rules incorporated into software 8. Each cell 24 has one or more associated cell parameters which define a performance specification for the cell 24. Cell parameters can include, among other things, gain, phase margin, harmonic distortion, settling time, power dissipation, input impedance, output impedance, and the like. Another cell parameter can include cell type. Examples of cell types include, among other things, an operational amplifier (OP AMP), an analog-to-digital converter (A/D), a digital-to-analog converter (D/A), a filter, a phase-locked-loop (PLL), a voltage controlled oscillator (VCO) and the like.

As discussed above, circuit 20 includes an interconnection of devices 22 and/or cells 24 that enable the realization of a desired performance characteristic for circuit 20. However, as shown in FIG. 2, devices 22 and/or cells 24 of circuit 20 can also be grouped into two or more interconnected blocks 26, e.g., blocks 26-0 and 26-1, where each block includes one or more devices 22 and/or one or more cells 24. Since blocks 26 and cells 24 simply represent different levels of integration of devices 22, hereinafter, the present invention will be described with reference to a hierarchical arrangement of devices 22 and cells 24. It is to be understood, however, that the description of the invention with reference to cell(s) and device(s) is not to be construed as limiting the invention.

Figure 3:
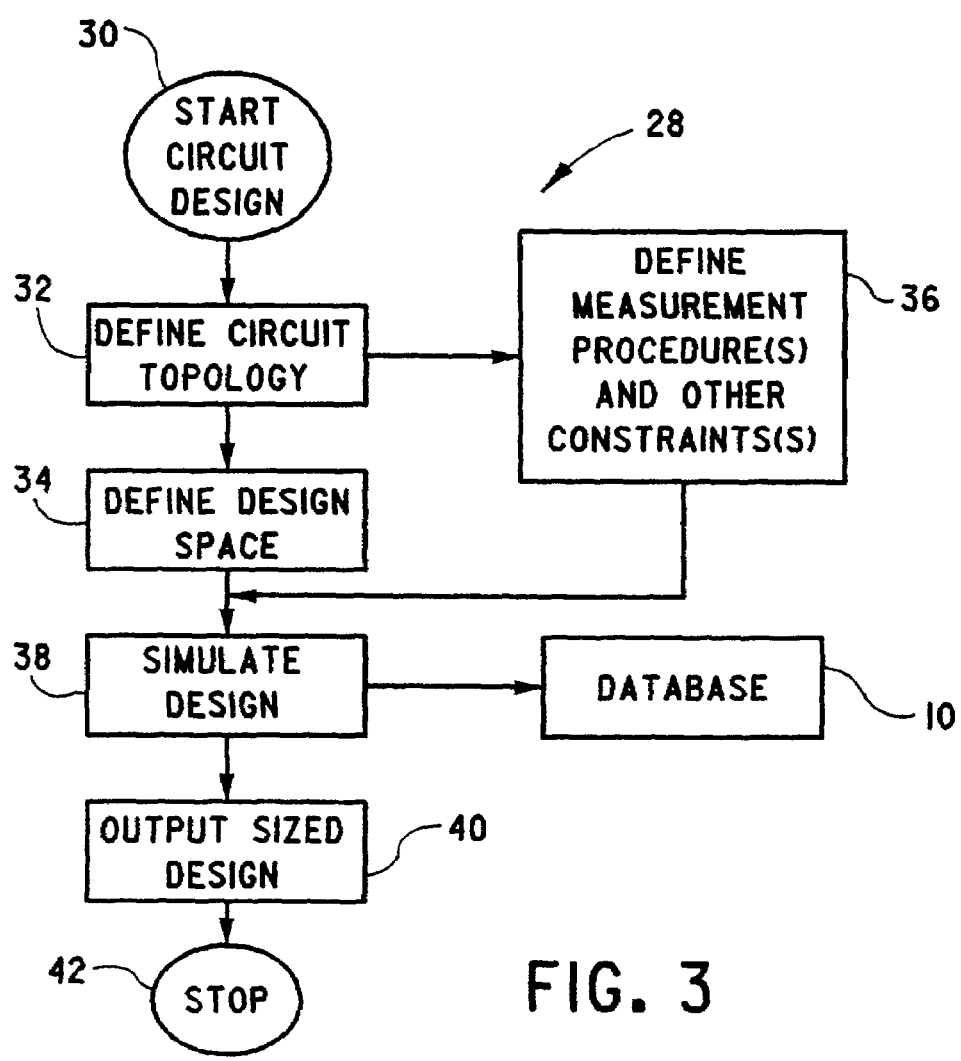
FIG. 3 is a flow diagram of a method for forming cell records for cells that can be utilized to form a circuit and for storing these cell records in a database.

With reference to FIG. 3 and with continuing reference to FIGS. 1 and 2, the process of developing database 10 to include a plurality of cell records 50 will now be described with reference to flow diagram 28. Initially, the process starts at step 30 and advances to step 32 where data regarding the type of devices 22 that form circuit 20 and the manner in which these devices 22 are connected are input by the user into user interface 16. In step 34, a design space for the devices 22 comprising circuit 20 is defined by the user at user interface 16. This design space includes a set of all possible designs for the devices 22 forming circuit 20. For transistors, each design may, for example, include a length, a width, and a number of fingers comprising the transistor. Out of this design space, the design of each device 22 forming circuit 20 is determined. In step 36, a measurement procedure and other constraints that are utilized to determine one or more performance characteristics of circuit 20 are defined. The measurement procedure and other constraints for circuit 20 are used to create a file which is input into a circuit simulator (not shown) which determines therefrom the performance characteristic of circuit 20. Once steps 32–36 are complete, circuit 20 is synthesized using a circuit simulator in step 38. The completed design of circuit 20 is then output in step 40. Steps 30–40 generally describe the steps that prior art integrated design software takes to design circuit 20.

During synthesis of circuit 20, one or more cells 24 representing higher level functions are formed in step 38. When circuit 20 is synthesized, one or more cell records 50 are created and included in database 10 for each cell 24 synthesized during step 38. This creation of one or more cell records 50 for each cell 24 and the inclusion of each cell record 50 in database 10 represents an important improvement over the prior art which did not create a cell record 50 of each cell 24 designed during synthesis of circuit 20 in step 38 and/or did not retain a cell record 50 of each cell design once the design of circuit 20 was complete.

Figure 4:
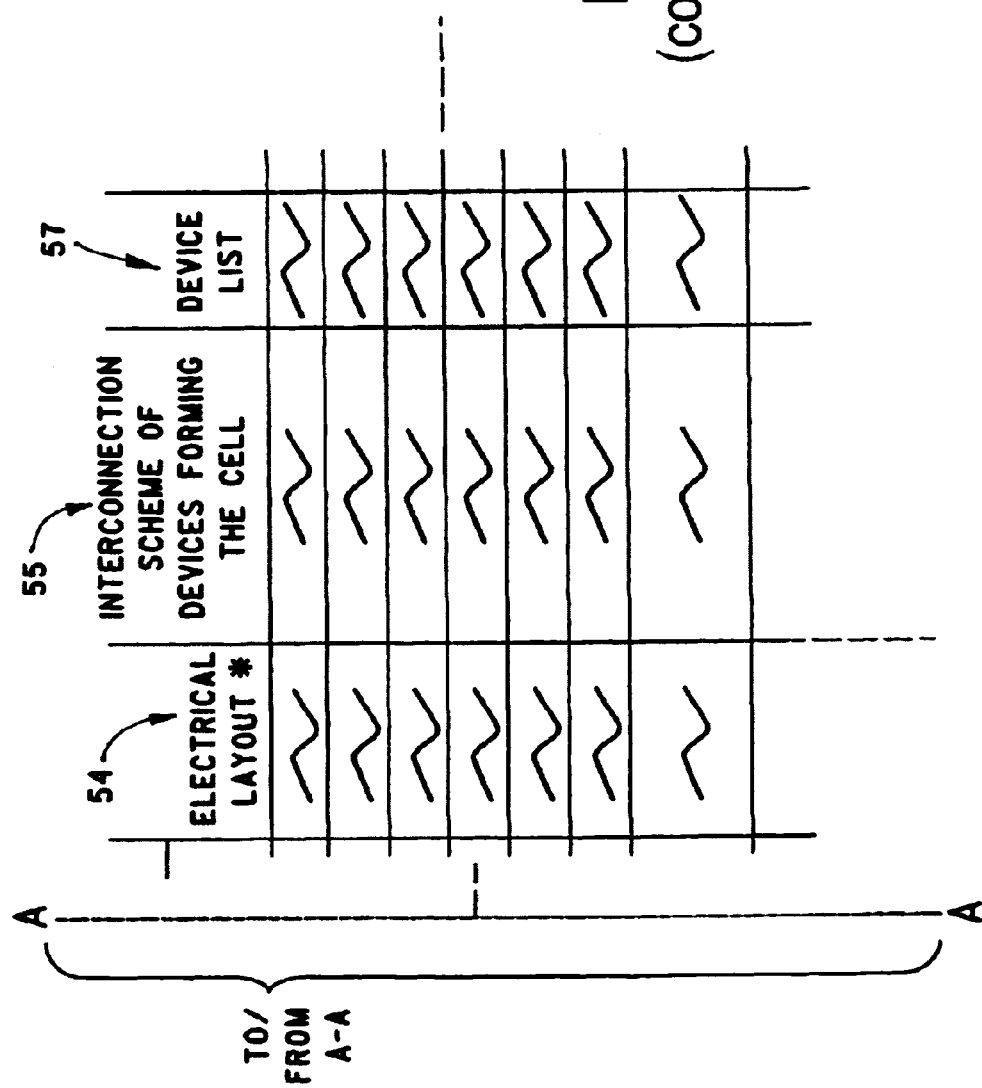
FIG. 4 shows in tabular form cell records stored in the database shown in FIG. 3.

As shown in FIG. 4, database 10 can include a plurality of cell records 50. Each cell record 50 can include for the cell 24 represented thereby data regarding a cell performance specification 52, an electrical layout 54 (optional), an interconnecting scheme 55 of devices 22 forming the cell 24 and a device list 57 which includes a list of devices 22 comprising the cell 24. Since cells 24 can be arranged in a hierarchical manner, where a higher level cell 24 can include one or more lower level cells 24, in addition to or alternatively to one or more devices 22, device list 57 also includes data regarding each of these lower level cells 24. Hereinafter, for simplicity of description, when used in connection with device list 57, the term "device" is intended to be construed as referring to a device 22 and/or a lower level cell 24, when applicable. Each cell record 50 can also include other data (not shown) that can be utilized by a circuit simulator for determining a performance characteristic for the circuit.

For each cell record 50, the cell performance specification can be included in one or more fields which collectively define the performance specification for the cell. One cell parameter may include cell type 58 which establishes the function the cell 24 is intended to perform. Examples of cell type 58 include, among other things, OP AMP, A/D, D/A, filter, and so forth. Associated with each cell type 58 is one or more other parameters. For example, when a cell record 50 is related to a cell type 58 OP AMP, the other parameters defining the performance specification for this cell may include, among other things, gain 60, phase margin 62, unity gain frequency 64, harmonic distortion 66, settling time 68 and power dissipation 70. Other cell parameters included in records 50 of database 10 may include other cell types 58, e.g., A/D, D/A, filters, etc., and other parameters (not shown) which, along with the parameter for the other cell type 58, collectively define the performance specification for the cell.

Each time design simulation step 38 shown in FIG. 3 generates a cell record 50, this cell record 50 is preferably stored in database 10. Prior to storage of each cell record 50 in database 10, however, one or more parameters of each cell record 50 generated during step 38 can be compared to parameters residing in cell records 50 stored in database 10. To avoid including redundant or unnecessary cell records 50 in database 10, when the cell parameters of a cell record 50 generated by design simulation step 38 matches or is within a predetermined tolerance of the cell parameters residing in a cell record 50 stored in database 10, the cell record 50 generated during step 38 can be discarded.

Figure 5:
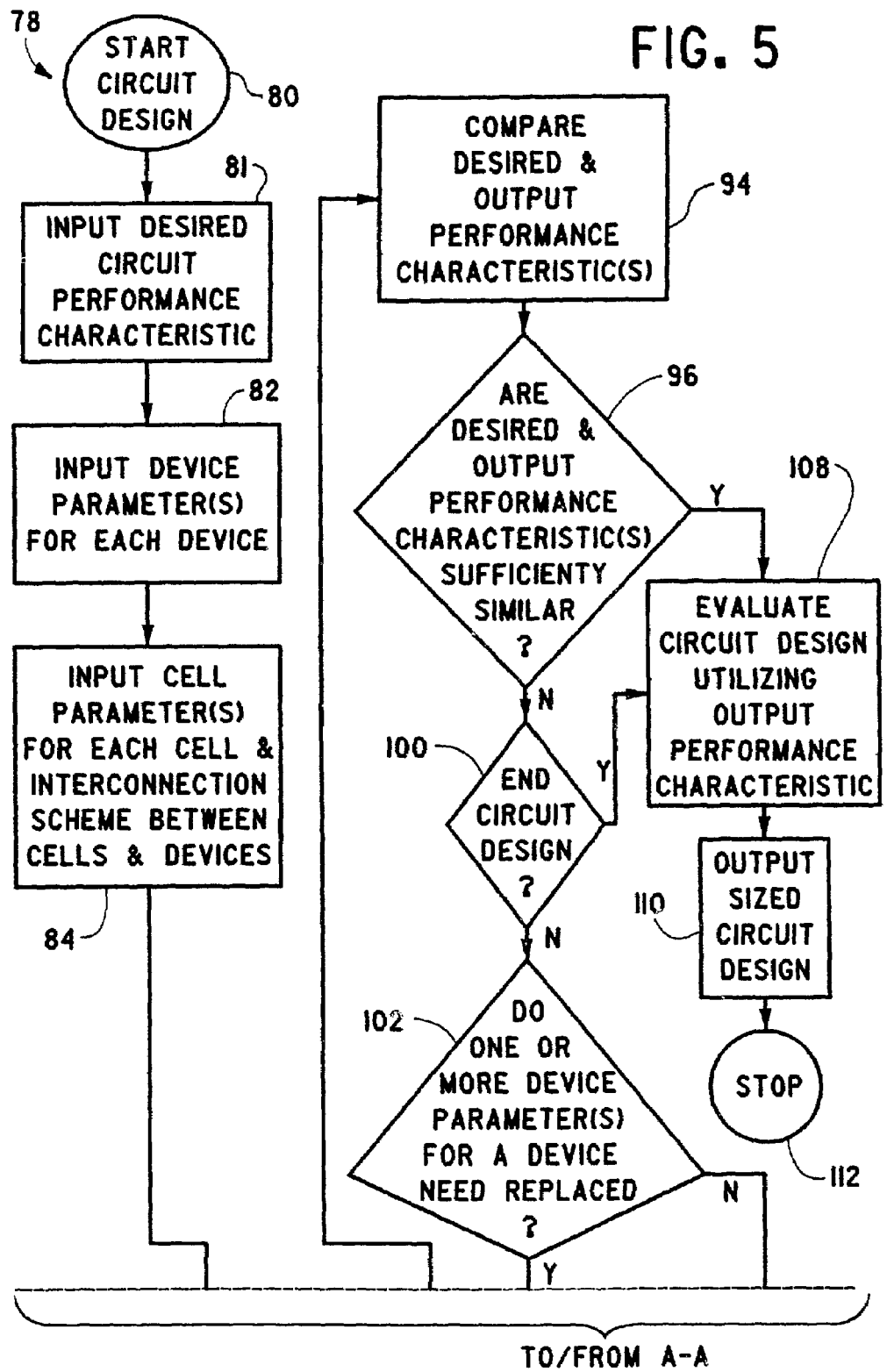
FIG. 5 is a flow diagram of a circuit design simulation in accordance with the present invention.
Figure 5:
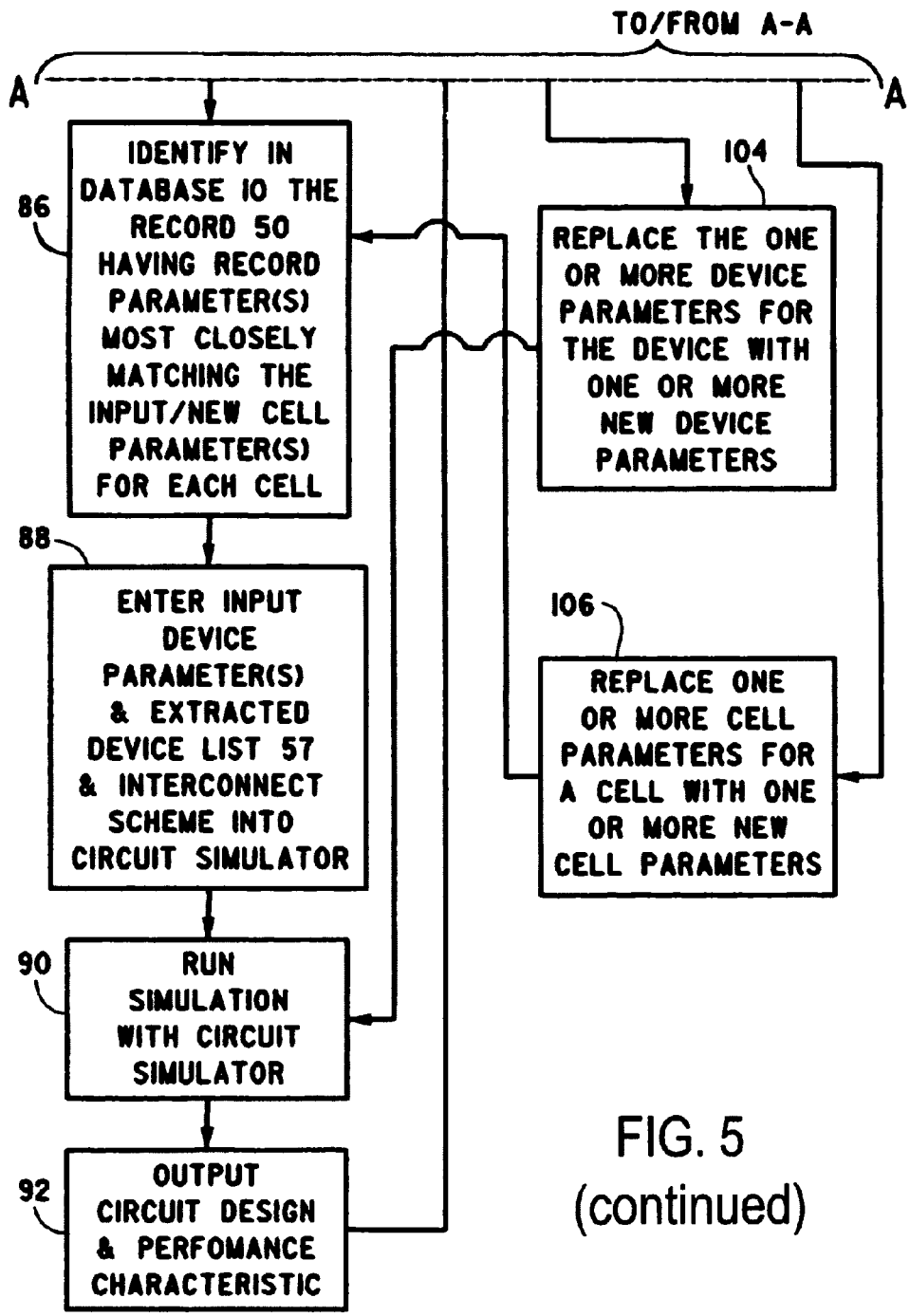
Figures 6, 7:
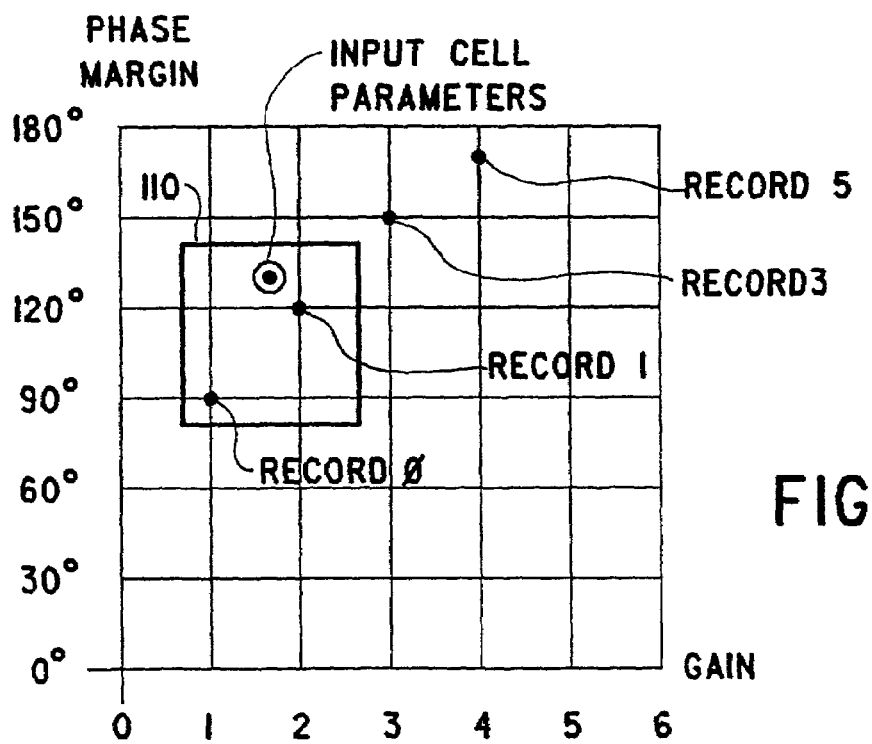
FIG. 6 is a table of inputs received for the devices shown in FIG. 2.
FIG. 7 is a plot showing gain versus phase margin of cell parameters included in certain cell records shown in FIG. 4 and input cell parameters for a desired cell of a circuit.

The process of designing circuit 20 utilizing one or more cell records 50 stored in database 10 will now be described with reference to flow diagram 78 shown in FIG. 5. After initiating a circuit design in step 80, the design process advances to step 81 where the desired circuit performance characteristic is input into user interface 16. Next, in step 82 device parameters for each device 22 to comprise circuit 20 are input into user interface 16. As shown in FIG. 6, the device parameters for each device 22 can include device type 72 and geometrical information about the device 22, such as length 74, width 75, number of fingers 76, etc. In step 84, cell parameters for each cell and the interconnecting scheme between inputs and outputs of cells 24 and devices 22 comprising circuit 20 are input into user interface 16. The parameters for each cell to comprise circuit 20 preferably include cell type and one or more other relevant cell parameters. For example, for a cell type OP AMP that comprises circuit 20, the other relevant cell parameters may include one or more of gain 60, phase margin 62, unity gain frequency 64, harmonic distortion 66, settling time 68 and power dissipation 70.

In step 86, the cell parameters input for each cell 24 to comprise circuit 20 are compared to like cell parameters residing in cell records 50 stored in database 10. For each cell 24 having its cell parameters input in step 84, the cell record 50 in database 10 having cell parameters most closely matching the input cell parameters is identified. For example, assume that for a particular cell 24, the cell parameters input in step 84 include cell type=OP AMP; gain=1.7; and phase margin=130°. In operation, step 86 first searches cell records 50 residing in database 10 for a match between the input cell type and cell types 58 residing in cell records 50 stored in database 10. In this example, the cell records 50 for record numbers 0, 1, 3 and 5 in FIG. 4 include a cell type=OP AMP. Next, utilizing techniques well known in the art of linear algebra, the cell record 50 for the cell type=OP AMP having its cell parameters most closely matching the input cell parameters is identified.

For the purpose of describing the present invention, it will be assumed that a record 50 resides in database 10 for each cell having its cell parameters input in step 84. However, this is not to be construed as limiting the invention since one or more cell parameters residing in a cell record 50 stored in database 10 may not be within acceptable tolerance (constraint) of like cell parameters input in step 84. For example, if a record 50 stored in database 10 does not have a cell type 58 corresponding to a cell type input in step 84, no record 50 will be identified in database 10. Under this circumstance, the cell parameters input for this cell and the interconnecting scheme for the devices and cells to comprise circuit 20 are passed through to the circuit simulator which will generate a cell 24 and a corresponding cell record 50.

Once generated, this cell record 50 can be stored in database 10 in the manner discussed above in connection with FIG. 3 for future use in the sizing and biasing of other circuits.

In step 88, the device parameters input in step 82 for each device are input into a circuit simulator. In addition, for each cell record 50 having cell parameters that most closely match input cell parameters for a cell 24 to comprise circuit 20, the device list 57 and the interconnecting scheme 55 for the devices 22 included in the device list 57 are extracted from the cell record 50 and input into the circuit simulator. Moreover, the interconnecting scheme input in step 84 is also input into the circuit simulator in step 88. Utilizing these inputs, the circuit simulator runs a simulation for circuit 20 in step 90. In step 92, the circuit simulator outputs a circuit design and a performance characteristic for circuit 20. The circuit design output in step 92 includes data equivalent to the interconnecting scheme 55 and device list 57 for a cell record 50. Similarly, the performance characteristic output in step 90 includes data equivalent to the cell performance specification 52 for a cell record 50. Because of this equivalency, a cell record 50 can be created for circuit 20 and this cell record 50 can be stored in database 10. In this cell record 50, the data comprising the performance specification for circuit 20 are stored in appropriate fields of the cell performance specification 52 and the data regarding the circuit design, especially the interconnection scheme and the device list, are stored in the appropriate fields for interconnection scheme 55 and device list 57 for the cell record 50.

In step 94, the desired performance characteristic input in step 81 is compared to the performance characteristic output from the circuit simulator. In step 96, a decision is made whether the selected and output performance characteristics are sufficiently similar. If not, a decision is made in step 100 whether to end the circuit design simulation. This decision can be based on, among other things, a time allotted for the circuit design or a predetermined number of design iterations. If the decision in step 100 is to continue the circuit design, the design process advances to step 102 where a decision is made whether one or more device parameters for a device 22 comprising circuit 20 can be replaced in order to improve the correspondence between the desired and output performance characteristics. If so, the design process advances to step 104 where one or more device parameters for the device are replaced with one or more new device parameters. Thereafter, the design process returns to step 90 where the circuit simulator runs the simulation with the new device parameters along with any preexisting device parameters and/or any preexisting cell parameters.

If, in step 102, it is determined that no device 22 requires its device parameters replaced, the design process advances to step 106 where one or more cell parameters for a cell are replaced with one or more new cell parameters. Thereafter, the design process returns to step 86 where a cell record 50 in database 10 having record parameters most closely matching the new cell parameters is identified. Thereafter, steps 88–96 are repeated for the new cell parameters along with any preexisting cell parameters and/or any preexisting device parameters.

When it is determined in step 96 that the selected and output performance characteristics are sufficiently similar, step 108 is executed. Similarly, when it is decided in step 100 that it is time to end the circuit design, step 108 is executed. In step 108, the circuit design output from the circuit simulator in step 92 is evaluated utilizing the performance characteristic output in step 92. Step 108 is essentially a final check by the user of computer 2 to ensure circuit 20 complies with the user's requirements. If desired, step 108 can be bypassed.

In step 110, the circuit design is sized and output. The sized circuit design includes, in addition to the devices 22 and/or cells 24 comprising circuit 20 and the interconnection scheme of these devices 22 and/or cells 24, data regarding the geometrical configuration and orientation of devices 22 and/or cells 24 comprising circuit 20 and data regarding the relative positions of these devices 22 and/or cells 24. If desired, the data regarding the geometrical configuration, orientation of devices and/or cells and the relative positions of these devices and/or cells can be stored in the field for the electrical layout 54 of a cell record 50 stored in database 10 for circuit 20. Lastly, in step 112, the circuit design process is terminated. After termination of the circuit design process in step 112, the sized circuit design output in step 110 can be provided to other software known in the art which generates a physical layout of the devices 22 and/or cells 24 comprising circuit 20 based on the data comprising the sized circuit design.

With reference to FIG. 7, and with ongoing reference to FIGS. 4 and 5, an example of a technique for determining which cell record 50 stored in database 10 includes cell parameters most closely matching cell parameters input in step 84 will now be described. FIG. 7 is a plot of gain 60 versus phase margin 62 for cell records 50 stored in database 10 having both a gain parameter 60 and a phase margin parameter 62 associated therewith. In FIG. 4, cell record numbers 0, 1, 3 and 5 for the cell type=OP AMP include parameters for gain 60 and phase margin 62. The gain and phase margin for these cell records 50 are shown as dots in FIG. 7. Now, assume that parameters for gain 60 and phase margin 62 for a cell type=OP AMP are input in step 84 of FIG. 5, where gain=1.7 and phase margin=130°. These input cell parameters are shown as a circled dot in FIG. 7.

As can be seen in FIG. 7, the cell parameters of gain 60 and phase margin 62 for cell record 50 number 1 are most closely related to the input cell parameters of gain 60 and phase margin 62. In order for CPU 4 of computer 2 to determine which record 50 stored in database 10 has cell parameters most closely matching the input cell parameters, CPU 4 utilizes linear algebra techniques. A simple example of a suitable linear algebra technique for determining the cell record 50 having its cell parameters most closely related to the input cell parameters input for a cell type=OP AMP will now be described.

The following Table 1 includes, in matrix form, cell parameters that can be input for a cell type=OP AMP in step 84 of flow diagram 78.

TABLE 1

$$\text{Input Cell Parameters} = \begin{bmatrix} G_S = \text{Input Gain} \\ PM_S = \text{Input Phase Margin} \\ UGF_S = \text{Input Unity Gain Frequency} \\ \vdots \\ PD_S = \text{Input Power Dissipation} \end{bmatrix}$$

The following Table 2 shows, in matrix form, cell parameters of a record 50 stored in database 10 for a cell type=OP AMP.

TABLE 2

$$\text{Cell Record x Parameters} = \begin{bmatrix} G_x \\ PM_x \\ UGF_x \\ \vdots \\ PD_x \end{bmatrix}$$

where x=0, 1, 3 and 5

The following Equation 1 shows a general form of a matrix equation for determining a distance or norm (L) between input cell parameters and cell parameters of a cell record 50 stored in database 10. (In the field of linear algebra "norm" is a generalization of the idea of length).

Equation 1:

$$\text{Distance}_{s \to x} = \begin{Vmatrix} W_G(G_S - G_x) \\ W_{PM}(PM_s - PM_x) \\ W_{UGF}(UGF_s - UGF_x) \\ \vdots \\ W_{PD}(PD_s - PD_x) \end{Vmatrix}_L$$

where

W=weighing applied to a particular cell parameter, e.g., gain weighting $W_G$=scalar value, such as 1.0, or a function $f(W_G, G_S, G_X)$ and phase margin weighting $W_{PM}$=a scalar value, such as 1.0, or a function $f(W_{PM}, PM_S, PM_X)$;

x=0, 1, 3 and 5 (for cell record nos. 0, 1, 3 and 5); and

L=an integer value related to the number of variables being considered to determine which cell record 50 has cell parameter(s) most closely related, i.e., closest, to the input cell parameter(s).

Equation 1 can be expressed in linear form as shown in the following Equation 2:

$$\text{Distance}_{s \to x} = [(W_G(G_S - G_X))^L + (W_{PM}(PM_S - PM_X))^L + \ldots + (W_{PD}(PD_S - PD_X))^L]^{1/L} \quad \text{Equation 2:}$$

The distance between input cell parameters and cell parameters of each cell record 50 having a corresponding cell type is determined and the cell record 50 associated with the shortest distance is the cell record 50 having cell parameters most closely matching the input cell parameters. The following Example for determining the distance between input cell parameters and cell parameters of cell record 50 number 0 in FIG. 4 illustrates how the distance therebetween is determined for the parameters of gain and phase margin.

Set $$\text{Input Cell Parameters} = \begin{bmatrix} G_S \\ PM_S \end{bmatrix} = \begin{bmatrix} 1.7 \\ 30° \end{bmatrix};$$

$$\text{Cell Record 0 Parameters} = \begin{bmatrix} G_0 \\ PM_0 \end{bmatrix} = \begin{bmatrix} 1 \\ 90° \end{bmatrix}; \text{and}$$

$$W = \begin{bmatrix} W_G \\ W_{PM} \end{bmatrix} = \begin{bmatrix} 1.0 \\ 1.0 \end{bmatrix}$$

Then, the norm or distance between the input cell parameters and the cell parameters of cell record 50 number 0 is determined as follows:

$$\text{Distance} = \begin{Vmatrix} 1.0(1.7 - 1.0) \\ 1.0(130° - 90°) \end{Vmatrix}_2 = (0.7^2 + 40^2)^{1/2} = 40.006$$

The foregoing procedure is then repeated for cell numbers 1, 3 and 5 whereafter a determination is made regarding which cell record number 0, 1, 3 or 5 has its cell parameters most closely related to the input cell parameters for the cell type OP AMP. As shown visually in FIG. 7, when $W_G$ and $W_{PM}$=1, cell record number 1 has its cell parameters most closely related to the input cell parameters.

In this example, based on determining that cell record 1 has its cell parameters most closely related to the input cell parameters, the interconnecting scheme 56 and device list 57 of cell record 1 are extracted from database 10 and entered into the circuit simulator in step 88.

In order to minimize the search of cell records 50 stored in database 10, the extent of searching cell records 50 for cell parameters most closely matching the input cell parameters can be limited by one or more constraints. For example, in FIG. 7, assume that the desired gain of the selected cell parameters is 1.7±1. Moreover, assume that the desired phase margin is 130°+10° and −50°. These constraints on the gain parameter 60 and phase margin parameter 62 limit the search of cell records 50 stored in database 10 to cell records 50 included within box 110 in FIG. 7.

As discussed above, a weighting W can be applied to one or more cell parameters when determining the shortest distance between input cell parameters and cell parameters residing in cell records 50 stored in database 10. Weighting enables desired emphasis to be applied to particular cell parameters for the determination of which cell record 50 has cell parameters most closely related to the input cell parameters. For example, for a circuit 20 where gain is deemed to be more important than, for example, phase margin, the value of the gain weighting $W_G$ can be increased relative to the value of the phase margin weighting $W_{PM}$ and/or the value of the phase margin weighting decreased relative to the value of the gain weighting $W_G$. Conversely, if the phase margin is deemed to be more important than gain, the value of the phase margin weighting $W_{PM}$ can be increased relative to the value of the gain weighting $W_G$ and/or the value of the gain weighting can be decreased relative to the value of the phase margin weighting $W_{PM}$. Thus, weightings W can be utilized to adjust the emphasis that one or more of the cell parameters has on the determination of which cell record has cell parameters most closely related to the input cell parameters.

As can be seen, the present invention utilizes database 10 to store cell records 50, each of which includes cell parameters, e.g., 58–70, which define the performance specification of a cell 24. Using linear algebra techniques, the distance or norm between cell parameters residing in records 50 stored in database 10 can be compared to input cell parameters for each cell to comprise a circuit 20 to determine which cell record 50 has cell parameters most closely related to the input cell parameters for each cell. Once this determination has been made, the interconnecting scheme 56 and device list 57 of the cell record 50 are extracted from the cell record 50 and entered into a circuit simulator along with any input device parameters and the related interconnection scheme to determine the design and performance characteristic of circuit 20.

The use of database 10 to store cell records 50, each of which includes a list of devices comprising the cell and an interconnecting scheme of the devices, enables the quick and efficient formation of circuit 20 for the purpose of circuit simulation. This, in turn, increases circuit simulation throughput by decreasing the time required to construct cells having untested cell parameters and, hence, an unknown cell performance characteristic. This, in turn, avoids iterative redesigns for one or more cells 24 of circuit 20 in order for circuit 20 to meet its desired performance characteristic.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of automatically sizing and biasing a circuit comprising the steps of:
   (a) providing a database including a plurality of records related to cells that are utilized to form a circuit, each record including (1) a layout of devices included in a cell, (2) an interconnection scheme of the devices included in a cell and (3) at least one cell parameter for the cell;
   (b) receiving a cell parameter of a cell for the circuit;
   (c) comparing the cell parameter input in step (b) to one or more cell parameters stored in the database, wherein comparing the cell parameter includes determining one or more distances between the received cell parameter and the one or more cell parameter stored in the database;
   (d) identifying a record in the database based on the comparison in step (c); and
   (e) determining from the record identified in step (d) a performance characteristic of the circuit.

2. The method as set forth in claim 1, further including the steps of:
   (f) inputting a device parameter for a device that comprises the circuit; and
   (g) determining the performance characteristic for the circuit from the input device parameter.

3. The method as set forth in claim 1, wherein step (e) includes the steps of:
   (e1) inputting data comprising the record identified in step (d) into a circuit simulator; and
   (e2) receiving the performance characteristic for the circuit from the circuit simulator.

4. The method as set forth in claim 1, wherein step (a) includes the steps of:
   (a1) determining a layout of the devices included in each cell;
   (a2) determining the interconnection scheme for the included in each cell;
   (a3) inputting the layout and interconnecting scheme for each cell into a circuit simulator;
   (a4) receiving at least one cell parameter from each cell into a circuit simulator; and
   (a5) creating a record in the database for each cell, each record including the layout of the devices comprising the cell, the interconnection scheme for the devices comprising the cell and the at least one cell parameter for the cell.

5. The method as set forth in claim 1, wherein:
   step (c) includes determining the cell parameter stored in the database that is most closely related to the cell parameter input in step (b); and
   step (d) includes identifying in the database the record that has the cell parameter that was determined to be the most closely related to the input cell parameter.

6. The method as set forth in claim 5, wherein the determination of the cell parameter stored in the database that is most closely related to the at least one cell parameter identified in step (b) is based on a weighting applied to the cell parameter of the record and the input cell parameter.

7. The method as set forth in claim 1, wherein step (c) includes the steps of:
   (c1) determining at least one cell parameter constraint;
   (c2) determining from the cell parameters stored in the database a plurality of cell parameters that comply with the at least one cell parameter constraint; and
   (c3) determining from the plurality of cell parameters that comply with the at least one cell parameter constraint the cell parameter that is most closely related to the input cell parameter.

8. The method as set forth in claim 7, wherein step (d) includes the step of identifying in the database the record having the cell parameter that was determined to be the most closely related to the input cell parameter.

9. The method as set forth in claim 7, wherein the at least one cell parameter constraint comprises a constraint on at least one of a cell type and another cell parameter.

10. The method as set forth in claim 1, wherein the comparison in step (c) includes determining a minimum distance from the one or more distances.

11. The method as set forth in claim 1, wherein the one or more distances measure one or more performance differences between the received cell parameter and the one or more cell parameter stored in the database.

12. The method as set forth in claim 1, wherein determining the one or more distances includes calculating a weighted combination of the received cell parameter and the one or more cell parameters stored in the database.

13. A method of automatically sizing and biasing a circuit formed from at least one cell having a plurality of interconnected devices, the method comprising the steps of:
   (a) providing a database having a plurality of cell records stored therein, each cell record including a layout of devices, an interconnection scheme for the devices and at least one cell parameter;
   (b) receiving a cell parameter for a cell that is utilized to form the circuit;
   (c) identifying in the database the cell record that includes a cell parameter that has a predetermined relation to the cell parameter received in step (b), wherein the identification of the cell record includes determining one or more distances between the received cell parameter and the one or more cell parameter stored in the database;
   (d) extracting from the cell record identified in step (c) the layout of devices and the interconnection scheme for the devices;
   (e) simulating the circuit utilizing the layout of devices and the interconnection scheme for the devices extracted in step (d); and (f) determining a performance characteristic for the circuit simulated in step (e).

14. The method as set forth in claim 13, further including the steps of:
(g) determining if the performance characteristic determined in step (f) has a predetermined relation to a desired performance characteristic; and
(h) if not, repeating steps (b)–(g) until the performance characteristic determined in step (f) has the predetermined relation to the desired performance characteristic, wherein a cell parameter received for each repetition of step (b) replaces a cell parameter received in a previous repetition of step (b).

15. The method as set forth in claim 14, further including, between steps (d) and (e), the steps of:
(d1) repeating steps (b)–(d) for each of a plurality of cells utilized to form the circuit; and
(d2) interconnecting the extracted layouts and interconnection schemes for the identified cells.

16. The method as set forth in claim 13, further including, between steps (d) and (e), the steps of:
(d1) repeating steps (b)–(d) for each of a plurality of cells utilized to form the circuit; and
(d2) interconnecting the extracted layouts and interconnection schemes for the identified cells.

17. The method as set forth in claim 13, wherein the predetermined relation in step (c) includes the cell parameter stored in the database that is most closely related to the cell parameter received in step (b).

18. The method as set forth in claim 17, wherein the determination of the cell parameter stored in the database that is most closely related to the cell parameter received in step (b) is based on a weighting applied to at least one of the cell parameters stored in the database and the cell parameter received in step (b).

19. The method as set forth in claim 13, wherein step (c) includes the steps of:
(c1) determining a constraint that is applied to cell parameters stored in the database;
(c2) determining cell parameters stored in the database that comply with the constraint; and
(c3) determining from the constraint compliant cell parameters the cell parameter stored in the database that has the predetermined relation to the cell parameters received in step (b).

20. The method as set forth in claim 13, further including the step of receiving a device parameter for a device that forms the circuit, wherein step (e) further includes simulating the circuit utilizing the received device parameter.

21. The method as set forth in claim 13, wherein step (a) includes the steps of:
(a1) determining a layout of devices forming each cell;
(a2) determining an interconnection scheme for the devices forming the cell;
(a3) inputting into a circuit simulator for the cell the determined layout and interconnection scheme;
(a4) receiving from the circuit simulator for the cell at least one cell parameter; and
(a5) inputting into the database a cell record for the cell, where the cell includes the determined layout and interconnection scheme and the received cell parameter.

22. The method as set forth in claim 13, wherein the identification in step (c) includes determining a minimum distance from the one or more distances.

23. The method as set forth in claim 13, wherein the one more distances measure one or more performance differences between the received cell parameters and the one or more cell parameters stored in the database.

24. The method as set in claim 13, wherein determining the one or more distances includes calculating a weighted combination of the received cell parameter and the one or more cell parameters stored in the database.

25. A method of automatically sizing and biasing a circuit comprising the steps of:
(a) providing a database including a plurality of records related to cells that is utilized to form circuits, each record including (1) a layout of devices included in a cell, (2) an interconnection scheme of the devices included in the cell and (3) at least one cell parameter for the cell;
(c) comparing the cell parameter received in step (b) to one or more cell parameters stored in the database;
(d) identifying a record in the database based on the comparison in step (c); and
(e) determining from the record identified in step (d) a performance characteristic of the circuit.

26. A method of automatically sizing and biasing a circuit formed from at least one cell having a plurality of interconnected devices, the method comprising the steps of:
(a) providing a database having a plurality of cell records stored therein, each cell record including a layout of devices, an interconnection scheme for the devices and at least one cell parameter;
(b) receiving a cell parameter for a cell that is utilized to form a circuit, wherein the received cell parameter includes a vector of cell parameters;
(c) identifying in the database the cell record that includes a cell parameter that has a predetermined relation to the cell parameter received in step (b);
(d) extracting from the cell record identified in step (c) the layout of devices and the interconnection scheme for the devices;
(e) simulating the circuit utilizing the layout of devices and the interconnection scheme for the devices extracted in step (d); and
(f) determining a performance characteristic for the circuit simulated in step (e).

27. A method of automatically sizing and biasing a circuit formed from at least one cell having a plurality of interconnected devices, the method comprising the steps of:
(a) providing a database having a plurality of cell records stored therein, each cell record including a layout of devices, an interconnection scheme for the devices and at least one cell parameter;
(b) receiving a cell parameter for a cell that is utilized to form a circuit;
(c) identifying in the database the cell record that includes a cell parameter that has a predetermined relation to the cell parameter received in step (b), wherein the predetermined relation includes a minimum distance;
(d) extracting from the cell record identified in step (c) the layout of devices and the interconnection scheme for the devices;
(e) simulating the circuit utilizing the layout of devices and the interconnection scheme for the devices extracted in step (d); and
(f) determining a performance characteristic for the circuit simulated in step (e).

28. A system for automatically sizing and biasing a circuit, the system comprising executable instructions for:
(a) providing a database including a plurality of records related to cells that are utilized to form circuits, each record including (1) a layout of devices included in a corresponding cell, (2) an interconnection scheme of the devices included in the corresponding cell and (3) at least one cell parameter for the corresponding cell;

(b) receiving a cell parameter of a cell for the circuit;

(c) comparing the cell parameter received in step (b) to one or more cell parameters stored in the database, wherein comparing the cell parameter includes determining one or more distances between the received cell parameter and the one or more cell parameters stored in the database;

(d) identifying a record in the database based on the comparison in step (c); and (e) determining from the record identified in step (d) a performance characteristic of the circuit.

29. The system as set forth in claim 28, wherein the comparison in step (c) includes determining a minimum distance from the one or more distances.

30. The system as set forth in claim 28, wherein the one or more distances measure one or more performance differences between the received cell parameter and the one or more cell parameters stored in the database.

31. The system as set forth in claim 28, wherein determining to one or more distances includes calculating a weighted combination of the received cell parameter and the one or more cell parameters stored in the database.

32. A system for automatically sizing and biasing a circuit formed from at least one cell having a plurality of interconnected devices, the system comprising executable instructions for:

(a) providing a database having a plurality of cell records stored therein, each cell record including a layout of devices, an interconnection scheme for the devices and at least one cell parameter;

(b) receiving a cell parameter for a cell that is utilized to form a circuit;

(c) identifying in the database the cell record that includes a cell parameter that has a predetermined relation to the cell parameter received in step (b), wherein the identification of the cell record includes determining one or more distances between the received cell parameter and the one or more cell parameters stored in the database;

(d) extracting from the cell record identified in step (c) the layout of devices and to interconnection scheme for the devices;

(e) simulating the circuit utilizing the layout of devices and the interconnection scheme for the devices extracted in step (d); and (f) determining a performance characteristic for the circuit simulated in step (e).

33. The system as set forth in claim 32, wherein the identification in step (c) includes determining a minimum distance from the one or more distances.

34. The system as set forth in claim 32, wherein the one more distances measure one or more performance differences between the received cell parameter and the one or more cell parameters stored in the database.

35. The system as set forth in claim 32, wherein determined the one or more distances includes calculating a weighted combination of the received cell parameter and the one or more cell parameters stored in the database.

36. A computer-readable medium encoded with a computer program for automatically sizing and biasing a circuit, the computer program comprising instructions for:

(a) providing a database including a plurality of records related to cells that can be utilized to form circuits, each record including (1) a layout of devices included in a corresponding cell, (2) an interconnection scheme of the devices included in the corresponding cell and (3) at least one cell parameter for the corresponding cell;

(b) receiving a cell parameter of a cell for a circuit;

(c) comparing the cell parameter received in step (b) to one or more cell parameters stored in the database, wherein comparing the cell parameter includes determining one or more distances between the received cell parameter and the one or more cell parameters stored in the database;

(d) identifying a record in the database based on the comparison in step (c); and (e) determining from the record identified in step (d) a performance characteristic of the circuit.

37. The computer-readable medium as set forth in claim 36, wherein the comparison in step (c) includes determining a minimum distance from the one or more distances.

38. The computer-readable medium as set forth in claim 36, wherein the one or more distances measure one or more performance differences between the received cell parameter and the one or more cell parameters stored in the database.

39. The computer-readable medium as set forth in claim 36, wherein determining the one or more distances includes calculating a weighted combination of the received cell parameter and the one or more cell parameters stored in the database.

40. A computer-readable medium encoded with a computer program for automatically sizing and biasing a circuit formed from at least one cell having a plurality of interconnected devices, the computer program comprising instructions for:

(a) providing a database having a plurality of cell records stored therein, each cell record including a layout of devices, an interconnection scheme for the devices and at least one cell parameter;

(b) receiving a cell parameter for a cell that is utilized to form the circuit;

(c) identifying in the database the cell record that includes a cell parameter that has a predetermined relation to the cell parameter received in step (b), wherein the identification of the cell parameter includes determining one or more distances between the received cell parameter and the one or more cell parameters stored in the database;

(d) extracting from the cell record identified in step (c) the layout of devices and the interconnection scheme for the devices;

(e) simulating the circuit utilizing the layout of devices and the interconnection scheme for the devices extracted in step (d); and (f) determining a performance characteristic for the circuit simulated in step (e).

41. The computer-readable medium as set forth in claim 40, wherein the identification in step (c) includes determining a minimum distance from the one or more distances.

42. The computer-readable medium as set forth in claim 40, wherein the one more distances measure one or more performance differences between the received cell parameter and the one or more cell parameters stored in the database.

43. The computer-readable medium as set forth in claim 40, wherein determining the one or more distances includes calculating a weighted combination of the received cell parameter and the one or more cell parameters stored in the database.

* * * * *